United States Patent
Park et al.

(10) Patent No.: US 7,616,937 B2
(45) Date of Patent: Nov. 10, 2009

(54) SUBHARMONIC MIXER CAPABLE OF REDUCING NOISE AND ENHANCING GAIN AND LINEARLTY

(75) Inventors: Jin-soo Park, Yongin-si (KR); Yong-hun Kim, Seoul (KR); Chang-sik Yoo, Bucheon-si (KR); Seong-soo Lee, Suwon-si (KR); Heung-bae Lee, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 443 days.

(21) Appl. No.: 11/438,223

(22) Filed: May 23, 2006

(65) Prior Publication Data

US 2007/0087721 A1 Apr. 19, 2007

(30) Foreign Application Priority Data

Oct. 14, 2005 (KR) .................. 10-2005-0097225

(51) Int. Cl.
*H04B 1/26* (2006.01)
*H04B 1/28* (2006.01)

(52) U.S. Cl. .................. 455/313; 455/323; 455/326; 455/333

(58) Field of Classification Search .......... 455/293, 455/313–326, 333
See application file for complete search history.

(56) References Cited

U.S. PATENT DOCUMENTS

| | | | |
|---|---|---|---|
| 6,226,509 B1 * | 5/2001 | Mole et al. | 455/302 |
| 6,348,830 B1 * | 2/2002 | Rebeiz et al. | 327/355 |
| 6,847,808 B2 * | 1/2005 | Zhou | 455/189.1 |
| 6,871,057 B2 * | 3/2005 | Ugajin et al. | 455/323 |
| 7,016,664 B2 * | 3/2006 | Souetinov | 455/323 |
| 7,062,247 B2 * | 6/2006 | Kovacevic et al. | 455/323 |
| 7,120,414 B2 * | 10/2006 | Kim et al. | 455/313 |
| 7,221,919 B2 * | 5/2007 | Takagi | 455/253.2 |
| 7,356,318 B2 * | 4/2008 | Sowlati | 455/168.1 |
| 7,417,486 B2 * | 8/2008 | Koutani et al. | 327/359 |

* cited by examiner

*Primary Examiner*—Simon D Nguyen
(74) *Attorney, Agent, or Firm*—Sughrue Mion, PLLC

(57) ABSTRACT

A subharmonic mixer, including an amplification unit for amplifying an input signal using at least one pair of amplification devices connected in parallel and a mixing unit for mixing the amplified signal with local oscillation signals from local oscillators is provided. The mixing unit performs switching over the amplification devices and at least four pairs of switching devices connected in parallel with each other, two pairs of switching devices being connected in parallel with each other and performing switching over one amplification device. The switching devices are supplied with local oscillation signals having different phases respectively, and two switching devices forming a pair are connected in parallel with each other and supplied with local oscillation signals having a 180° phase difference therebetween. Accordingly, the switching stage is formed with one stage, the operation is enabled with low-voltage power supplies, and noise performance, linearity, and gain are enhanced.

11 Claims, 4 Drawing Sheets

Periodic Steady State Response

Periodic Steady State Response

Periodic Noise Response

Periodic Noise Response

SUBHARMONIC MIXER CAPABLE OF REDUCING NOISE AND ENHANCING GAIN AND LINEARLTY

CROSS-REFERENCE TO RELATED APPLICATIONS

This application claims benefit under 35 U.S.C. § 119 from Korean Patent Application 10-2005-0097225, filed on Oct. 14, 2005, the entire contents of which are incorporated herein by reference.

BACKGROUND OF THE INVENTION

1. Field of the Invention

The present invention relates to a subharmonic mixer, and more particularly to a subharmonic mixer capable of operating with a low-voltage power supply, reducing 1/f noise, and enhancing gain and linearity.

2. Description of the Prior Art

The direct conversion receiver is being actively studied as one of the receivers having a structure which can be built in a single chip. Since the direct conversion receiver can reduce external devices such as filters or the like as well as reducing the digital signal-processing load, the direct conversion receiver has a structure most suitable for fabrication of a single chip by use of a CMOS process facilitating the implementation of a digital circuit. Direct conversion receivers include a radio frequency (RF) direct conversion receiver for converting an RF signal into a base band signal, and an intermediate frequency (IF) direct conversion receiver for converting an RF signal into a specific IF signal and then converting the IF signal into a base band signal.

A mixer used for such a direct conversion receiver mixes a wireless frequency signal with a local oscillation signal (LO+) and a local oscillation signal (LO−) orthogonal to the local oscillation signal (LO+), thereby outputting two base band vector signals I and Q.

The subharmonic mixer, unlike a typical mixer using a CMOS Gilbert cell, forms plural stages serving as a switching stage, down-converting a frequency to a base band frequency through several stages. Such down-converting of a frequency through several stages can prevent the self missing of a local oscillator (LO self missing) leaking an LO signal into an input stage of a mixer through parasitic capacitance or the like.

FIG. 1 is a circuit diagram for showing a conventional subharmonic mixer used for a direct conversion receiver.

As shown in FIG. 1, the subharmonic mixer has a pair of amplification devices M11 and M12, and also has an amplification part 10 amplifying and supplying an input signal to a mixing part 20 and the mixing part 20 containing plural pairs of switches.

The mixing part 20 includes the first switching device group MA11, MA12, MB11, and MB12 for switching the amplification device M11 and the second switching device group MA21, MA22, MB21, and MB22 for switching the amplification device M12.

The switching devices MA11 and MB11 of the first switching device group form a cascode structure with the source and drain of the devices connected to each other, and the switching devices MA12 and MB12 also form a cascode structure. Further, the switching devices MA11 and MA12 and the switching devices MB11 and MB12 are connected in parallel, respectively. The switching devices MB11 and MB12 are supplied with local oscillation signals having a phase of 270° and a phase of 90°, respectively, and the switching devices MA11 and MA12 are supplied with local oscillation signals having a phase of 180° and a phase of 0°, respectively. Thus, the local oscillation signals input to the switching devices MA11 and MA12 have a phase difference of 180°, and the local oscillation signals inputted to the switching devices MB11 and MB12 have a phase difference of 180°. Since the first switching device group has two switching stages in the cascode structure, the first switching device group forms a frequency two times higher than a frequency of a local oscillation signal input to the gate of each switching device even though a frequency corresponding to a half a frequency for a general mixer is applied. Thus, the problems of dc-offset and LO self missing which occur in a conventional general mixer can be prevented since the local oscillation signal and the input signal have the same frequency.

The second switching device group brings out the same effect since it has the same structure as the first switching device group.

However, since such a subharmonic mixer has two switching stages and has a voltage drop occurring across each switching device, the subharmonic mixer has difficulties in operations at low voltages due to the voltage head room.

Since the switching devices M11 and M12 operate as amplifiers in the RF direct conversion receiver, the DC offset problem occurs as well as the non-linearity even though a high gain is obtained due to the amplifier characteristics. Further, each switching device produces less 1/f noise as smaller electric current is applied thereto, but requires electric current larger than a certain level for operations in the amplification part 10, so each switching device inevitably produces the 1/f noise. Since such 1/f noise increases as a frequency decreases from a high frequency to a low frequency, it is important to reduce the 1/f noise in the RF direct conversion receiver outputting a low-frequency base band signal.

SUMMARY OF THE INVENTION

The present invention improves upon drawbacks associated with conventional arrangements of subharmonic mixers. An aspect of the present invention provides a subharmonic mixer capable of operating with a low-voltage power supply, reducing 1/f noise, and enhancing gain and linearity.

The advantages are substantially realized by providing a subharmonic mixer, comprising an amplification unit for amplifying an input signal using at least one pair of amplification devices connected in parallel with each other, and a mixing unit for mixing the amplified signal from the amplification unit with local oscillation signals from local oscillators. The mixing unit performs switching over the respective amplification devices and at least four pairs of switching devices connected in parallel with each other, two pairs of switching devices being connected in parallel with each other and performing switching over one amplification device. The switching devices are supplied with local oscillation signals having different phases, and two switching devices forming a pair are connected in parallel with each other and supplied with local oscillation signals having a 180° phase difference therebetween.

Each switching device of the mixing unit may be formed with a PMOSFET, and each amplification device of the amplification unit is formed with an NMOSFET.

A high-pass filter for eliminating high-frequency noise can be formed between the sources of the two pairs of switching devices of the mixing unit and the drain of the amplification device of the amplification unit. The high-pass filter can be a capacitor.

Each amplification device of the amplification unit and the two pairs of switching devices of the mixing unit can be independently DC-based.

A resonance unit can be formed between a DC bias-input stage and each amplification device, the resonance unit eliminating noise components other than a frequency band in use from an amplified signal through each amplification device. The resonance unit can have inductors and capacitors connected in parallel with each other.

A source attenuation unit can be formed between the sources of the amplification devices, the source attenuation unit improving linearity by attenuating the sources. The source attenuation unit can be any of a resistor and an inductor.

A low-pass filter can be connected to a pair of drains of the two pairs of switching devices performing switching over one of the amplification devices and to a pair of drains of the two pairs of switching devices performing switching over the other amplification device, respectively. The low-pass filter can be formed with capacitors and resistors connected in parallel.

BRIEF DESCRIPTION OF THE DRAWINGS

The above aspects and features of the present invention will be more apparent by describing exemplary embodiments of the present invention with reference to the accompanying drawings, in which.

DESCRIPTION OF EXEMPLARY EMBODIMENTS

Hereinafter, exemplary embodiments of the present invention will be described in detail with reference to the accompanying drawings.

Figure 2:
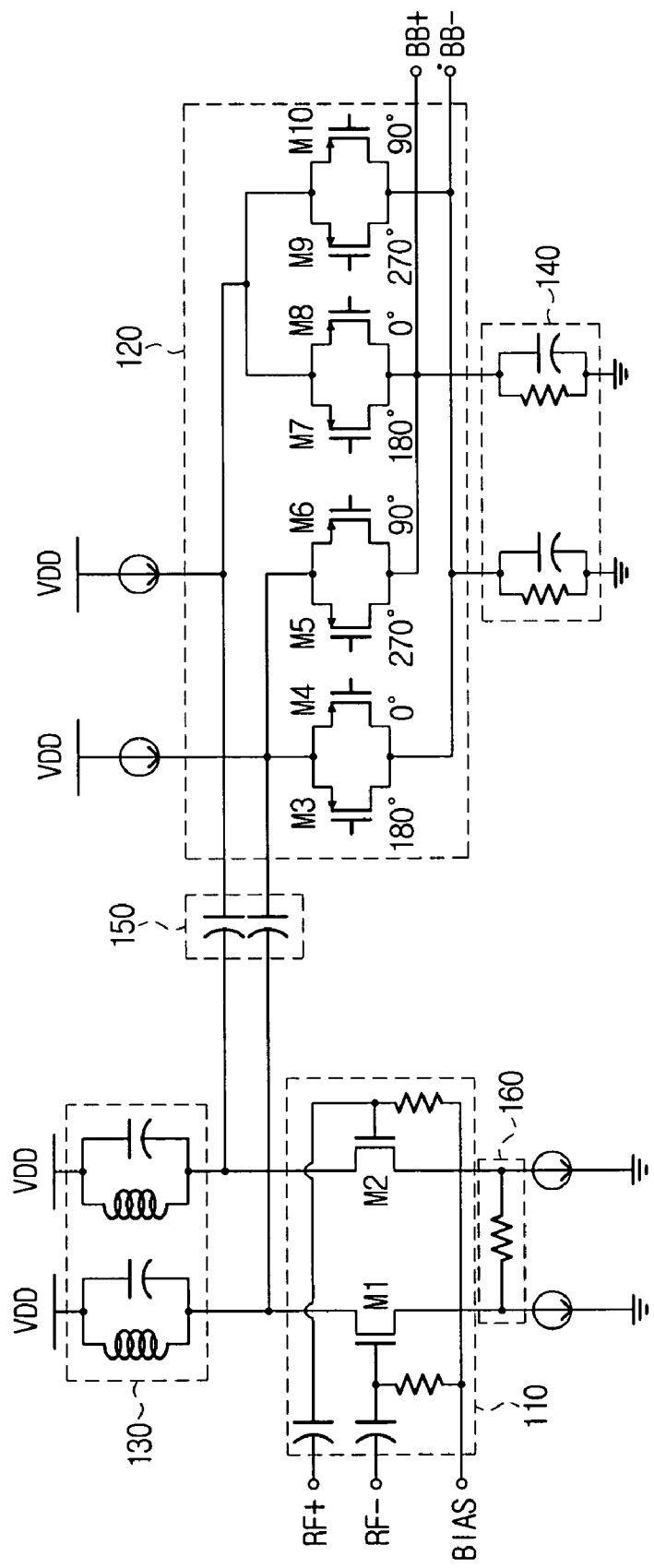
FIG. 2 is a circuit diagram for showing a subharmonic mixer according to an exemplary embodiment of the present invention.

FIG. 2 is a circuit diagram for showing a subharmonic mixer according to an exemplary embodiment of the present invention. As shown in FIG. 2, the subharmonic mixer may have an amplification unit 110, a mixing unit 120, a resonance unit 130, a source attenuation unit 160, a low-pass filter 140, and a high-pass filter 150.

The amplification unit 110 may have amplification devices M1 and M2 connected in parallel with each other, and an RF signal input to the gates of the amplification devices M1 and M2. The amplification devices M1 and M2 may comprise NMOSFET, and enable a high gain to be obtained due to the NMOSFET characteristics.

A source attenuation unit 160 may be connected between sources and the amplification devices M1 and M2 to attenuate the sources. The source attenuation unit 160 reduces the high gain of the amplification devices M1 and M2, but increases the linearity. Since a high enough gain is obtained from the amplification devices M1 and M2, the use of the source attenuation unit 160 for obtaining the linearity does not reduce the performance of the mixer even though the gain is somewhat lowered. In general, resistors or inductors may be used for the source attenuation unit 160.

The resonance unit 130 may be connected between the amplification devices M1 and M2 and voltage sources supplying electric power to the respective amplification devices M1 and M2. The resonance unit 130 may comprise inductors and capacitors connected in parallel. The resonance unit 130 eliminates noise components other than a frequency band in use from an amplified signal through the respective amplification devices M1 and M2. Since the noise-eliminated signal from the resonance unit 130 is delivered to the mixing unit 120 and down-converted, the components other than those in the signal band, that is, noise, can be eliminated.

The mixing unit 120 may comprise four pairs of switching devices of which the first pair of switching devices M3 and M4 and the second pair of switching devices M5 and M6 may be connected to the amplification device M1 and the third pair of switching devices M7 and M8 and the fourth pair of switching devices M9 and M10 may be connected to the amplification device M2. The individual switching devices forming each pair of switching devices may be connected in parallel with each other, source-to-source and drain-to-drain.

The first pair of switching devices M3 and M4 and the second pair of switching devices M5 and M6 each may have the sources connected in parallel with each other, and the sources connected in parallel may be connected to the amplification device M1. Likewise, the third pair of switching devices M7 and M8 and the fourth pair of switching devices M9 and M10 each may have the sources connected in parallel with each other, and the sources connected in parallel with each other may be connected to the amplification device M2. The drain of the first pair of switching devices M3 and M4 may be connected to the drain of the fourth pair of switching devices M9 and M10, and the drain of the second pair of switching devices M5 and M6 may be connected to the drain of the third pair of switching devices M7 and M8.

The local oscillation signals each having a 0° phase and a 180° phase may be respectively input to the switching devices of the first pair of switching devices M3 and M4, and the local oscillation signals each having a 270° phase and a 90° phase may be respectively input to the switching devices of the second pair of switching devices. That is, the respective switching devices of the first and second pairs of switching devices connected in parallel with each other may input the local oscillation signals having a 180° phase difference therebetween and switch the amplification device M1.

Likewise, the local oscillation signals each having a 180° phase and a 0° phase may be respectively input to the switching devices of the third pair of switching devices M7 and M8, the local oscillation signals each having a 270° phase and a 90° phase may be respectively input to the switching devices of the fourth pair of switching devices M9 and M10, and the respective switching devices of the third and fourth pairs of switching devices may switch the amplification device M2.

Figure 1:
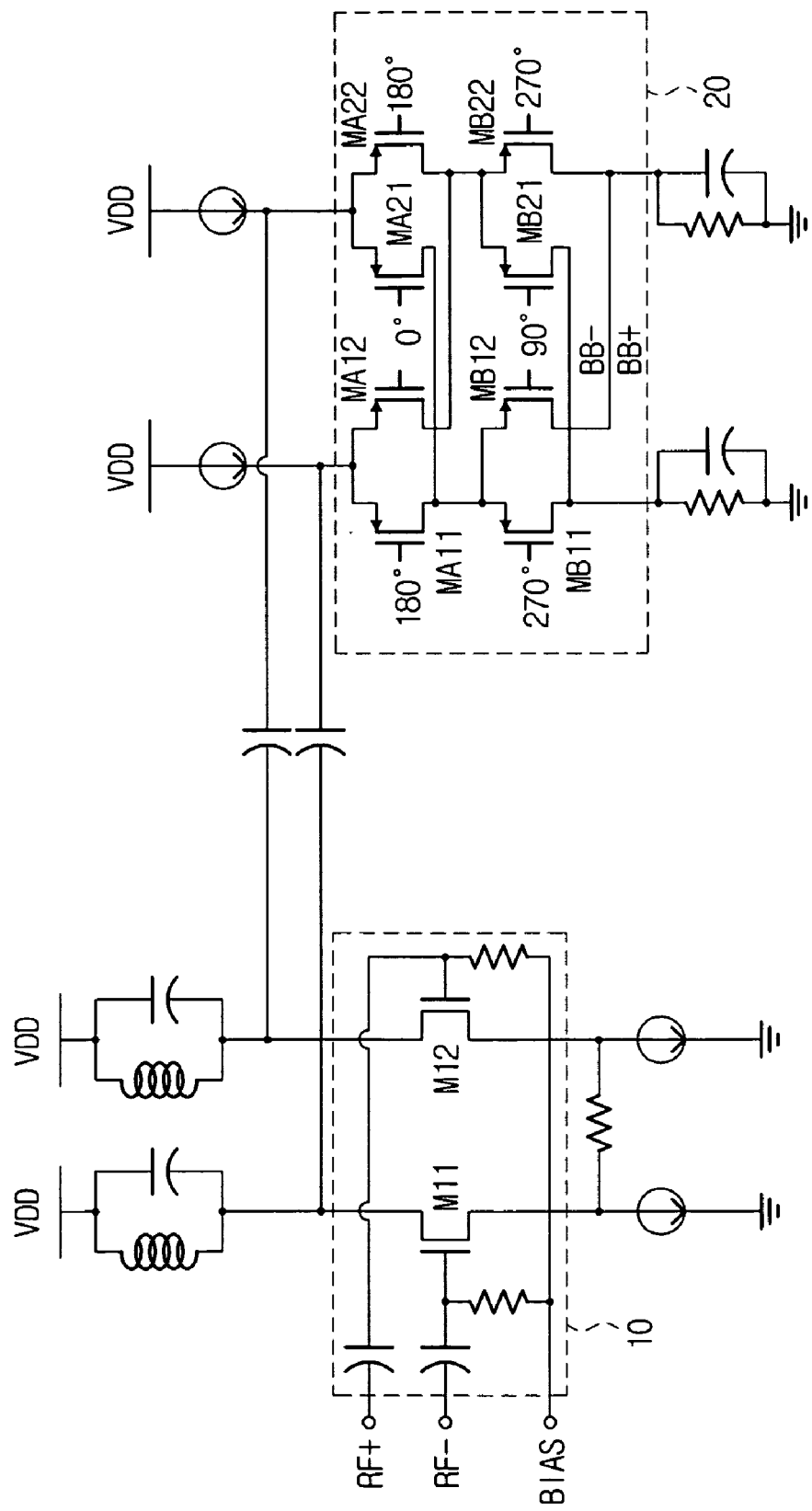
FIG. 1 is a circuit diagram for showing a subharmonic mixer used in a conventional direct conversion receiver.

Such individual pairs of switching devices of the mixing unit 120 may be connected in parallel with each other, having a folded cascode structure converted from the cascode structure of the two pairs of switching devices included in the first switching device group in the conventional mixer shown in FIG. 1. Thus, the pairs of switching devices of the mixing unit 120 of the mixer may be formed as one stage unlike prior art.

Each switching device of such a mixing unit 120 may comprise a PMOSFET. Since the PMOSFET has less noise in general, it is known that the PMOSFET is suitable to reduce the 1/f noise that increases as frequencies vary from high to low frequencies. Thus, the use of the PMOSFET for each switching device can reduce the 1/f noise.

Low-voltage power supplies may be directly connected for direct DC bias to the first and second pairs of switching devices and the third and fourth pairs of switching devices. Further, a capacitor as the high-pass filter 150 may be respectively connected between the first and second pairs of switching devices and the amplification device M1 and between the third and fourth pairs of switching devices and the amplification device M2.

The capacitor filters low-frequency noise, so the capacitor can greatly reduce direct or/and indirect noise components occurring in the mixing unit 120. Further, the use of the capacitor enables a DC bias to be independently applied to the mixing unit 120 and the amplification unit 110, which facilitates operations with the low-voltage power supplies. Even though current consumption may increase with the DC bias applied to the mixing unit 120 and the amplification unit 110, the mixer has an advantage of widening an operation range since the mixer can operate with low voltages.

The mixing unit 120 needs low current to reduce noise, but the amplification unit 110 needs high current. Since the use of the DC bias can be taken into account when power is supplied if the DC bias is applied to the mixing unit 120 and the amplification unit 110, respectively, there exists an advantage in that the mixing unit 120 and the amplification unit 110 can be optimally designed. Since the optimized power can be supplied to the mixing unit 120 and the amplification unit 110 as above, the gain is enhanced and the noise and non-linearity are reduced, so the performance of the circuit can be improved.

The low-pass filter 140 may be connected to the drains of the first pair of switching devices M3 and M4 and to the drains of the fourth pair of switching devices M9 and M10, respectively. The low-pass filter 140 may comprise a resistor and a capacitor connected in parallel with each other, and, if the capacitor of the low-pass filter 140 is used in parallel with the MOSFETs of each pair of switching devices being output load impedance, distortions due to the leakage of local oscillation signals, and high-frequency components, and so on, can be reduced.

Figure 3A:
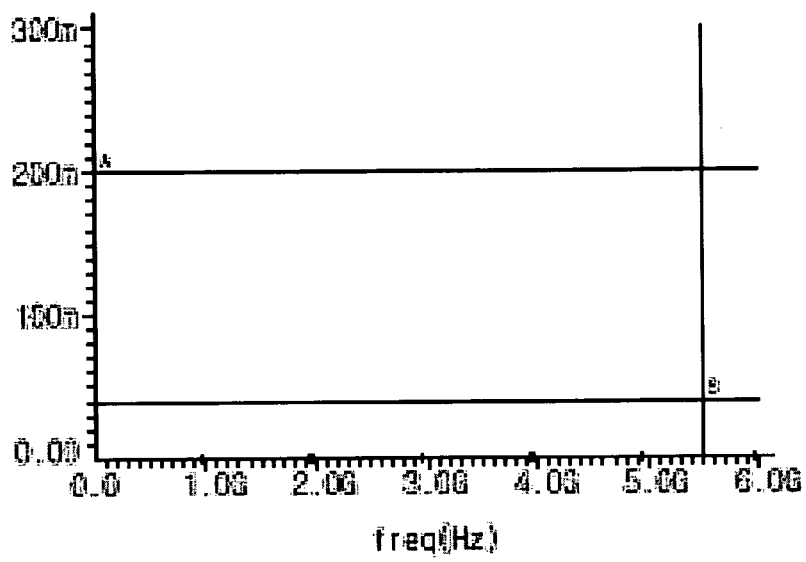
FIG. 3A is a graph for showing a voltage conversion gain as the subharmonic mixer according to an exemplary embodiment of the present invention operates.
Figure 3B:
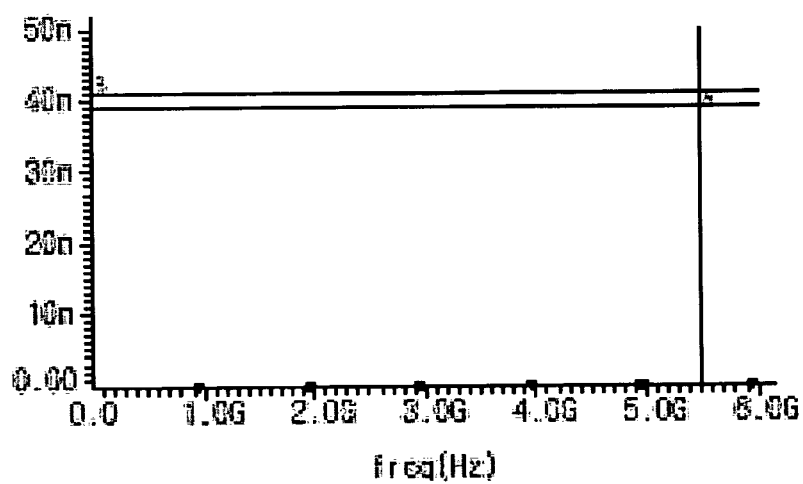
FIG. 3B is a graph for showing voltage conversion gain measurements as the conventional subharmonic mixer operates.

FIG. 3A and FIG. 3B are graphs for showing voltage conversion gain measurements respectively obtained as the subharmonic mixer of an exemplary embodiment of the present invention and the conventional subharmonic mixer operate. Both graphs are obtained by measurements under the same conditions of a power supply voltage of 1.8V, current consumption of 6 mA, and output resistance of 2KΩ.

The voltage conversion gain of the subharmonic mixer of the exemplary embodiment of the present invention is 12.5 dB, which is calculated when the input and output shown in the graph of FIG. 3A are used, and the voltage conversion gain of the subharmonic mixer of the present invention is 0 dB when the input and output shown in FIG. 3B are used. That is, it can be seen that the subharmonic mixer of the present invention has a much higher voltage conversion gain than the conventional subharmonic mixer has.

Figure 4A:
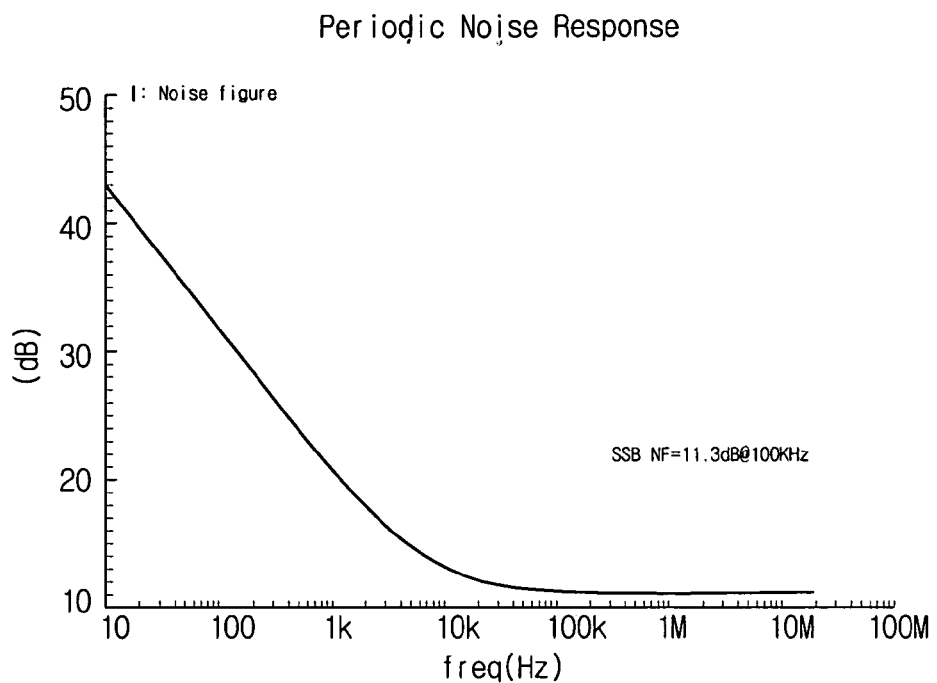
FIG. 4A is a graph for showing noise measurements as the subharmonic mixer according to an exemplary embodiment of the present invention operates.
Figure 4B:
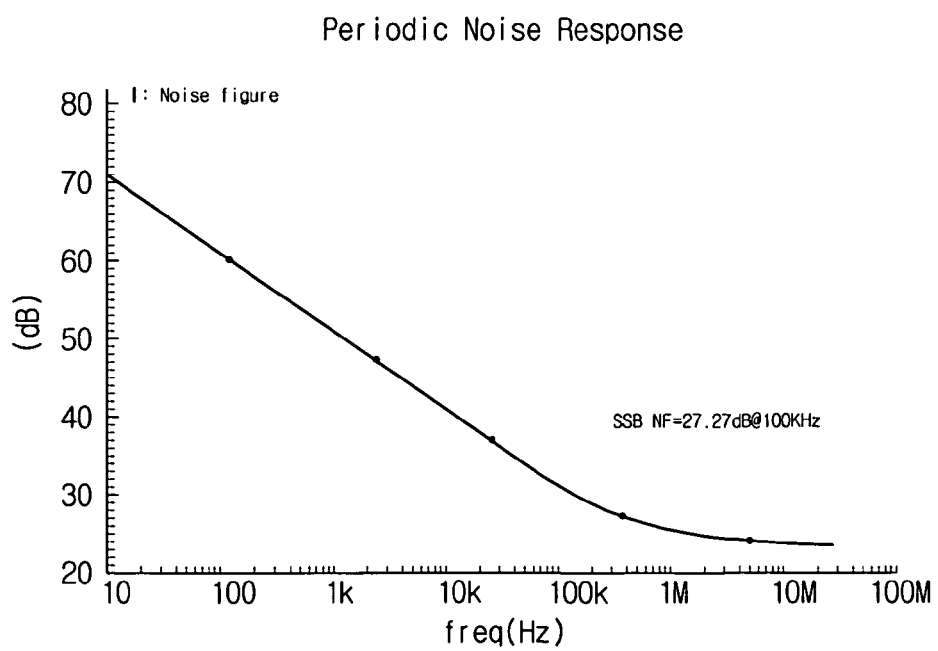
FIG. 4B is a graph for showing noise measurements as the conventional subharmonic mixer operates.

FIG. 4A and FIG. 4B are graphs for showing noise measurements respectively obtained as the subharmonic mixer of an exemplary embodiment of the present invention and the conventional subharmonic mixer operate. Both graphs are obtained under the same simulation conditions, and noise is generally measured and compared at 100KHz.

As shown in the graph of FIG. 4A, the subharmonic mixer reduces noise as frequencies vary from low to high frequencies and has a steady noise value of 11.3 dB at 100KHz. On the other hand, as shown in the graph of FIG. 4B, the conventional subharmonic mixer is still reducing noise with a value of 27.27 dB at 100KHz. That is, it can be seen that the subharmonic mixer of the present invention abruptly reduces noise compared to the conventional subharmonic mixer.

As above, the subharmonic mixer of the exemplary embodiment of the present invention may be built as one stage with the plural pairs of switching devices of the mixing unit 120 each having the drain-to-drain and source-to-source connections, so the subharmonic mixer can operate with low-voltage power supplies since the voltage head room is greatly reduced. Further, since the subharmonic mixer is used with the capacitors mounted between the mixing unit 120 and the amplification unit 110, the subharmonic mixer can eliminate low-frequency noise, thereby enhancing its noise performance. Furthermore, since the DC bias can be applied separately to the mixing unit 120 and the amplification unit 110 respectively, the subharmonic mixer can easily operate with low-voltage power supplies as well as effectively enhancing the characteristics of the mixing unit 120 and the amplification unit 110. Still further, since the subharmonic mixer uses the low-pass filter 140, capacitors, source attenuation unit 160, and so on, the subharmonic mixer can eliminate noise other than band and the 1/f nose as well as improve the linearity.

As aforementioned, since exemplary embodiments of the present invention have the switching stage built therein as one stage, the present invention can operate with low-voltage power supplies, operate with the best performance of the mixing unit and amplification unit, and improve noise performance, linearity, and gain.

The foregoing embodiments and advantages are merely exemplary and are not to be construed as limiting the present invention. The present teaching can be readily applied to other types of apparatuses. Also, the description of the exemplary embodiments of the present invention are intended to be illustrative, and not to limit the scope of the claims, and many alternatives, modifications, and variations will be apparent to those skilled in the art.

What is claimed is:

1. A subharmonic mixer, comprising:
   an amplification unit comprising at least one pair of amplification devices connected in parallel to amplify an input signal; and
   a mixing unit configured to mix the amplified signal with local oscillation signals from local oscillators,
   wherein the mixing unit performs switching over the respective amplification devices and comprises at least first, second, third and fourth pairs of switching devices connected in parallel, the first and second pairs of switching devices being connected in parallel with each other and performing switching over one amplification device, and the third and fourth pairs of switching devices being connected in parallel with each other and performing switching over the other amplification device, and the switching devices of each of the first, second, third and fourth pairs being supplied with a local oscillation signal having a different phase respectively, and two switching devices forming each of the first, second, third and fourth pairs being connected in parallel and supplied with local oscillation signals having a 180° phase difference therebetween, and the first and second pairs having sources connected to each other and the third and fourth pairs having sources connected to each other, and DC bias being directly applied to the sources of the first, second, third and fourth pairs of switching devices between the amplification unit and the mixing unit, wherein each of the switching devices of the mixing unit comprises a PMOSFET.

2. The subharmonic mixer of claim 1, wherein each amplification device of the amplification unit comprises an NMOSFET.

3. The subharmonic mixer of claim 1, further comprising a high-pass filter disposed between sources of the first and second pairs of switching devices of the mixing unit and a drain of one amplification device of the amplification unit.

4. The subharmonic mixer of claim 3, wherein the high-pass filter is a capacitor.

5. The subharmonic mixer of claim 1, wherein each amplification device of the amplification unit and each of the first, second, third and fourth pairs of switching devices of the mixing unit are independently DC-based.

6. The subharmonic mixer of claim 5, further comprising a resonance unit disposed between a DC bias-input stage and each amplification device, the resonance unit eliminating noise components other than a frequency band in use from an amplified signal through each amplification device.

7. The subharmonic mixer of claim 6, wherein the resonance unit comprises inductors and capacitors connected in parallel.

8. The subharmonic mixer of claim 1, further comprising a source attenuation unit disposed between sources of the amplification devices, the source attenuation unit improving linearity by attenuating the sources.

9. The subharmonic mixer of claim 8, wherein the source attenuation unit is any of a resistor and an inductor.

10. The subharmonic mixer of claim 1, further comprising a low-pass filter connected to a pair of drains of the first and second pairs of switching devices performing switching over one of the amplification devices and to a pair of drains of the third and fourth pairs of switching devices performing switching over the other amplification device, respectively.

11. The subharmonic mixer of claim 10, wherein the low-pass filter comprises capacitors and resistors connected in parallel.

* * * * *